United States Patent
Akkerman et al.

(10) Patent No.: US 10,847,235 B2
(45) Date of Patent: Nov. 24, 2020

(54) REMAPPING OPERATIONS

(71) Applicant: HEWLETT PACKARD ENTERPRISE DEVELOPMENT LP, Houston, TX (US)

(72) Inventors: Ryan Akkerman, Plano, TX (US); Craig Warner, Plano, TX (US); Joseph Orth, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 263 days.

(21) Appl. No.: 15/761,111

(22) PCT Filed: Sep. 30, 2015

(86) PCT No.: PCT/US2015/053085
§ 371 (c)(1),
(2) Date: Mar. 19, 2018

(87) PCT Pub. No.: WO2017/058184
PCT Pub. Date: Apr. 6, 2017

(65) Prior Publication Data
US 2018/0268913 A1 Sep. 20, 2018

(51) Int. Cl.
*G06F 11/10* (2006.01)
*G11C 16/34* (2006.01)
*G11C 13/00* (2006.01)
*G11C 29/02* (2006.01)
*G11C 29/44* (2006.01)
*G11C 29/00* (2006.01)

(52) U.S. Cl.
CPC ...... *G11C 16/3495* (2013.01); *G06F 11/1068* (2013.01); *G11C 13/0035* (2013.01); *G11C 16/349* (2013.01); *G11C 29/028* (2013.01); *G11C 29/4401* (2013.01); *G11C 29/76* (2013.01)

(58) Field of Classification Search
CPC ............. G06F 11/1068; G11C 16/3495; G11C 16/349; G11C 16/4401
See application file for complete search history.

(56) References Cited

U.S. PATENT DOCUMENTS

| 5,819,307 | A  | * | 10/1998 | Iwamoto ............. | G06F 12/0246 711/103 |
| 6,462,992 | B2 | * | 10/2002 | Harari .................. | G06F 3/0601 365/185.19 |
| 8,495,284 | B2 |   | 7/2013  | Iver et al. | |
| 8,745,741 | B1 |   | 6/2014  | Tice et al. | |
| 8,925,098 | B2 |   | 12/2014 | Hyde et al. | |

(Continued)

OTHER PUBLICATIONS

Doe Hyun Yoon, "Free-p: Protecting Non-volatile Memory Against Both Hard and Soft Errors," Feb. 17, 2011, http://lph.ece.utexas.edu/users/dhyoon/pubs/freep_hpca11_slides.pdf>.

(Continued)

*Primary Examiner* — Yolanda L Wilson
(74) *Attorney, Agent, or Firm* — Hewlett Packard Enterprise Patent Department

(57) ABSTRACT

A remapping rate of remapping operations on a memory module may be determined. Each remapping operation may comprise storing a pointer to an unfailed memory location within a failed memory location. A wear-leveling rate on the memory module may be adjusted based on the remapping rate.

9 Claims, 4 Drawing Sheets

(56) References Cited

U.S. PATENT DOCUMENTS

| | | | | |
|---|---|---|---|---|
| 2004/0083335 A1* | 4/2004 | Gonzalez | ............ | G06F 12/0246 |
| | | | | 711/103 |
| 2005/0055495 A1* | 3/2005 | Vihmalo | ............. | G06F 12/0246 |
| | | | | 711/103 |
| 2006/0047920 A1* | 3/2006 | Moore | .................. | G06F 3/0607 |
| | | | | 711/154 |
| 2009/0259819 A1* | 10/2009 | Chen | .................... | G06F 13/4239 |
| | | | | 711/165 |
| 2012/0324141 A1* | 12/2012 | Seong | ................. | G06F 12/0238 |
| | | | | 711/3 |
| 2013/0013886 A1* | 1/2013 | Franceschini | ....... | G06F 12/0246 |
| | | | | 711/202 |
| 2013/0238839 A1 | 9/2013 | Weingerten et al. | | |
| 2013/0332799 A1* | 12/2013 | Cho | ........................ | G06F 11/10 |
| | | | | 714/764 |
| 2014/0137271 A1 | 5/2014 | Hyde et al. | | |
| 2014/0189284 A1* | 7/2014 | Hyuseinova | ........ | G06F 12/0238 |
| | | | | 711/206 |

OTHER PUBLICATIONS

M.K. Querishi, "Phase Change Memory From Devices to Systems," Nov. 22, 2011, http://ir.nmu.org.ua/bitstream/handle/123456789/132954/73d1653afc9677ed7b4ce78bf2806fd3.pdf?seguence.

The International Search Report and the Written Opinion of the International Searching Authority dated Jul. 8, 2016; PCT/US2015/053085; 11 Pages.

Moinuddin K. Qureshi et al., "Practical and Secure PCM Systems by Online Detection of Malicious Write Streams", 2011, pp. 478-489.

\* cited by examiner

REMAPPING OPERATIONS

BACKGROUND

Non-volatile memory (NV memory) such as memristor memory, phase change memory (PCM), and resistive memory may be used as main memory in computer systems. Some NV memory technologies may have write endurance less than dynamic random access memory (DRAM). Systems employing these NV memory technologies may utilize wear-leveling to remap heavily written lines to less frequently written lines. This wear-leveling may mitigate the lower endurance of NV memory.

BRIEF DESCRIPTION OF THE DRAWINGS

Certain examples are described in the following detailed description and in reference to the drawings, in which.

DETAILED DESCRIPTION OF SPECIFIC EXAMPLES

Dynamic memory repair mechanisms may further improve NV memory device lifetimes. For example, a free pool of spare memory locations may be allocated on a device. When a memory location fails, the failed memory location may be remapped to one of the spare, unfailed, memory locations. Typically, when a memory location fails, only a subset of the bits in the location has failed. The failed memory location may still have many functional bits that can be used to store information. In some memory repair implementations, a pointer to the unfailed memory location may be stored in the failed memory location. The pointer may be protected by a robust error correcting code (ECC). For example, in an implementation where the system writes to memory in last level cache line sizes (e.g., 64B), a 64-bit pointer may be stored using a 7-modular-redundancy (7-MR) code, which replicates the 64-bit pointer 7 times. In these implementations, each memory location may include a 1-bit flag that indicates whether the memory location stores data or a pointer to an unfailed memory location. In some cases, the memory control unit performing the memory repair may maintain a cache of remapping pointers. When a read or write request for an address of a failed memory location is received, the pointer stored in the failed location is read (possibly by reading the cache) and the pointer address is substituted for the failed memory address.

Wear-leveling typically adds performance overhead to a memory sub-system. Accordingly, a system may be designed to minimize this overhead by using a wear-leveling rate that accounts for normal memory activities. Certain workloads, such as malicious code, may target specific addresses more frequently than the normal case (i.e., "attack a memory device"). Unchecked, these workloads may significantly reduce the lifetime of a memory device. For example, an attacking workload may increase the rate of memory repair, exhausting the free pool of spare memory locations.

Implementations of the disclosed technology provide mechanisms to detect when a memory device is under attack based on the rate of memory repair. For example, a possible attack may be detected if a rate of repair remapping operations increases exceeds a threshold. In some cases, wear-leveling parameters are adjusted based on the detection of the attack. In further cases, an alert may be provided to an operating system, management system, or system connected to the memory sub-system. In still further cases, a functionality of the memory device may be reduced in response to an attack. For example, in response to detecting that a memory device is under attack, the bandwidth of the device may be reduced or the frequency of allowed access to the region under attack may be reduced.

Figure 1:
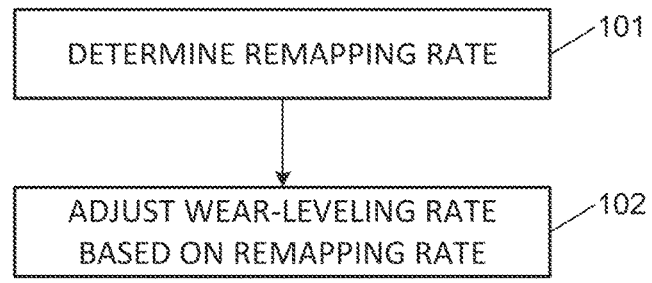
FIG. 1 illustrates an example method of adjusting a wear-leveling rate of a memory module based on a rate of remapping operations.

FIG. 1 illustrates an example method of adjusting a wear-leveling rate of a memory module based on a rate of remapping operations. For example, the method may be performed by a memory control unit coupled to the memory module. For example, the memory control unit may be a system main memory controller or an intermediary memory controller between the system's main memory controller and the memory module.

The example method may include block 101. Block 101 may include determining a remapping rate of remapping operations on a memory module. Each remapping operation may comprise storing a pointer to an unfailed memory location within a failed memory location. These remapping operations may be performed as described above with respect to example dynamic memory repair mechanisms. For example, the remapping operations may remap failed memory locations to memory locations within a free pool for spare memory locations. In some implementations, the memory locations may be memory blocks that are subject to wear-leveling. For example, the memory locations may be cache line sized blocks.

In some implementations, block 101 may be performed by a maintaining a counter of remapping operations. For example, the device performing the remapping operations may be coupled to a counter and may increment the counter each time it performs a remapping operation. The device determining the remapping rate reading the counter at a counter reading rate to determine the remapping rate. For example, the device may poll the counter at regular intervals to determine the remapping rate.

In some implementations, the same device may perform the remapping operations and the remapping rate determination. For example, a memory control unit coupled to the memory module may perform the remapping operations and block 101. In other implementations, different devices may perform the remapping operations and the remapping rate determination. For example, a media controller within the memory module may perform the remapping operations and maintain the counter, and a memory controller collocated with a system processor may poll the controller and determine the remapping rate determination.

Block 102 may include adjusting the wear-leveling rate on the memory module based on the remapping rate. For example, the wear-leveling rate may be increased by a set amount if the remapping rate exceeds a threshold. As another example, the wear-leveling rate may be decreased by the set amount if the remapping rate is less than a second threshold. In some cases, the set amount and the thresholds may be parameters entered during system configuration. In other cases, the set amount and the threshold may be fixed values set based on the type of NV memory used in the system and the types of workloads to which the system will be typically be subject. Because the increase in the wear-leveling rate will reduce the remapping rate, the second threshold will typically be lower than the first threshold.

Figure 2:
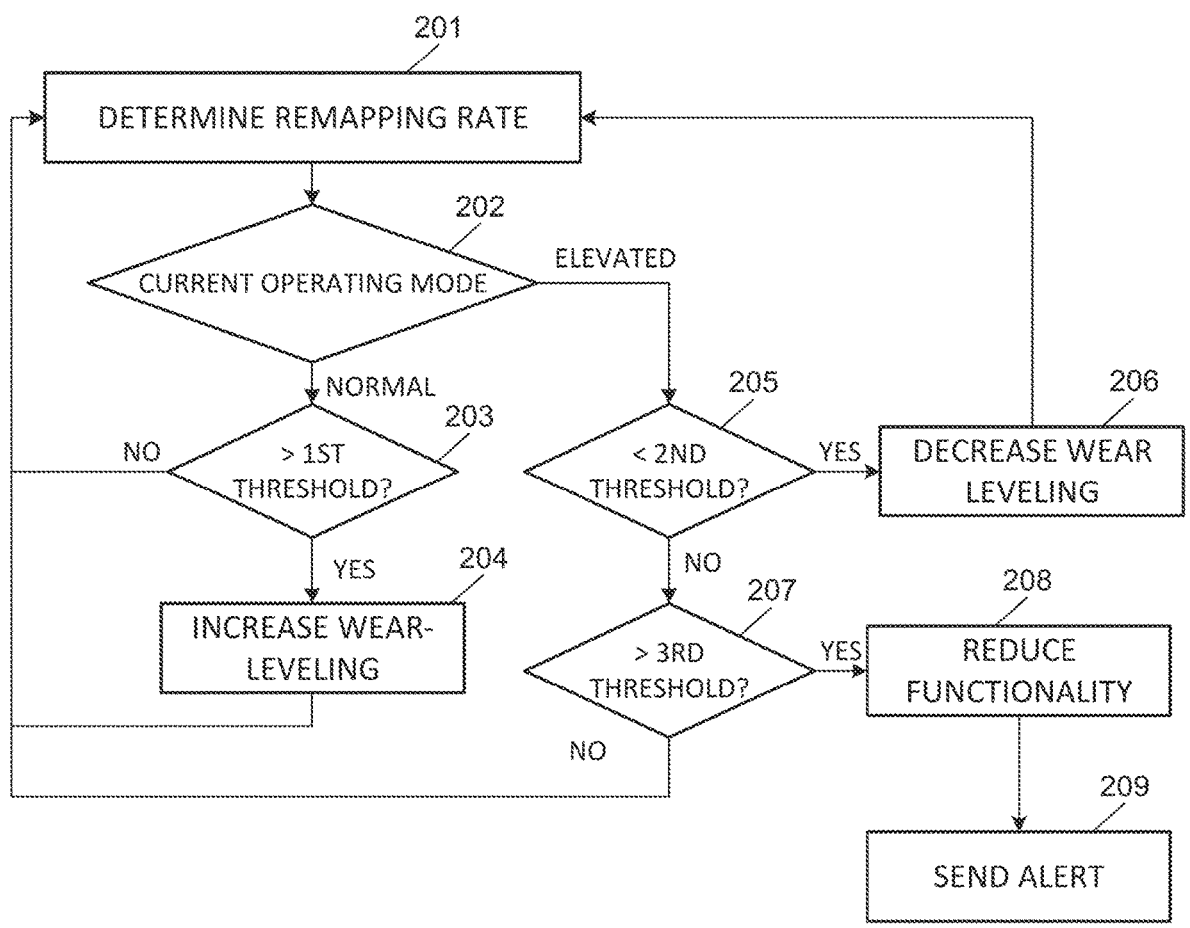
FIG. 2 illustrates a method of adjusting the wear-leveling rate on a memory module.

FIG. 2 illustrates a method of adjusting the wear-leveling rate on a memory module. For example, the method of FIG. 2 may be a further implementation of the method of FIG. 1.

The method may include block 201. Block 201 may be performed as described with respect to block 101 of FIG. 1. For example, block 201 may include maintaining a counter of remapping operations and reading the counter at a counter reading rate. As another example, block 201 may be performed by a rate determining circuit, such as an application specific integration circuit (ASIC) or field programmable gate array (FPGA). The rate determining circuit may receive a signal each time a remapping operation is performed and a clock signal, and may use the signals to determine a current remapping rate.

The method may further include block 202. In block 202, the system performing the method may determine a current wear-leveling mode. If the system is in a normal wear-leveling mode, the method proceeds to block 203.

In block 203, the system determines whether the current remapping rate exceeds a first threshold. If the remapping rate is less than the first threshold, then the system returns to step 201 for another iteration. If the remapping rate is greater than the first threshold, then the system proceeds to block 204 and increases the wear-leveling rate. For example, increasing the wear-leveling rate may comprise increasing the frequency in which memory addresses are remapped for wear-leveling. In an example implementation, start gap wear-leveling is applied to the memory module. In this example, block 204 may comprise increasing the gap movement rate from a first value, N, to N+k. In some implementations, N and k may be set during system initialization.

After block 204, the system returns to block 201, determines the current remapping rate, and proceeds to block 202. During this iteration, the system is in an elevated remapping state and the system proceeds to block 205. In block 205, the system determines whether the remapping rate is below a second threshold value. For example, the remapping rate falling below the second threshold may indicate the attack on the memory module has stopped. Because increasing the wear-leveling rate will correspondingly decrease the remapping rate, the second threshold may correspond to a lower remapping rate than the first threshold. The second threshold may be set during system initialization and may depend on the expected reduction in the remapping rate caused by the increase in the wear-leveling rate performed in block 204.

If the remapping rate has fallen below the second threshold, then the system proceeds to block 206 and decreases the wear-leveling rate. In some case, the system may return the remapping rate to a normal operational rate. For example, the system may return to a normal gap movement rate. N. After performing block 206, the system returns to block 201.

If the remapping rate has not fallen below the second threshold, the system proceeds to block 207. In block 207, the system determines if the remapping rate is greater than a third threshold value. For example, this may indicate that the memory module is under a stronger attack than increasing the wear-leveling rate can compensate for. If so, the system proceeds to block 208 and reduces a functionality of the memory module.

For example, reducing the functionality of the memory module may comprise reducing write access to the failed memory location (which has been remapped to the unfailed memory location). For example, reducing write access to the failed memory location may include reducing frequency of allowed writes to the failed memory location or ceasing to allow writes to the failed memory location. The amount of reduction of allowed writes may be a parameter set during system initialization. As another example, reducing the functionality of the memory module may comprise reducing the maximum bandwidth to the memory module. Reducing the functionality of the memory module may provide time for the operating system or management system to identify the workload causing the increased remapping rate.

After block 208, the system may proceed to block 209. In block 209, the system may send an alert based on the remapping rate. For example, the memory control unit determining the remapping rate may send the alert to an operating system or a management system. In some implementations, the alert may include the current remapping rate or an indication that the remapping rate has exceeded a particular threshold value. In further implementations, block 209 may include sending the memory locations that have been remapped. This information may be used by the receiving system to determine which processes are causing the memory attack. In the illustrated example, the alert may be sent if the remapping rate exceeds the third threshold value.

Figure 3:
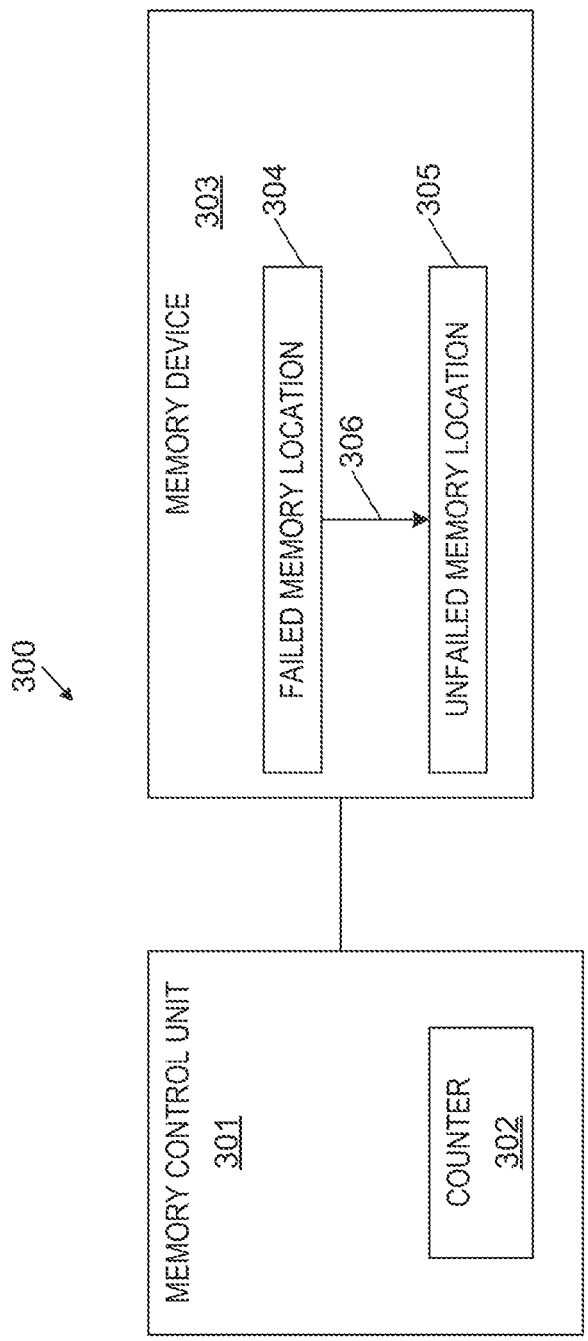
FIG. 3 illustrates an example memory system including a memory control unit and a memory device.

FIG. 3 illustrates an example memory system 300 including a memory control unit 301 and a memory device 303. In some implementations, the components of the system may be distributed throughout a computer system. For example, the memory control unit 301 may be a memory controller integrated with or collocated with a central processing unit (CPU). In other implementations, the memory control unit 301 may be copackaged with the memory device 303. For example, the memory device 303 and the memory control unit 303 may be within a Dual Inline Memory Module (DIMM) form factor. In further implementations, the memory system 300 may be a printed circuit assembly (PCA) with a separate memory control unit 303 and memory device 303 disposed on a printed circuit board (PCB). In these implementations, the memory control unit 301 may be intermediary to the main system memory controller and may communicate with the memory controller via a memory bus.

The memory device 303 may comprise a plurality of memory locations 304, 305. For example, the device 303 may comprise memory chips, each chip comprising a plurality of individual NV memory cells. For example, the cells may be memristors, phase change memory, resistive memory, or other NV memory cells.

The memory control unit 301 may remap a failed memory location 304 to an unfailed memory location 305 by storing a pointer 306 to the unfailed memory location 305 in the failed memory location 304. In some implementations, the memory control unit 301 may include a microcontroller executing firmware, an ASIC, an FPGA, or a combination thereof, to perform the remapping. For example, the memory device 303 may include a first pool of memory used for normal data storage and a second pool of spare memory. When a memory location within the first pool wears out, the memory control unit may remap the worn out memory location to a location within the spare pool. Once a failed location is remapped, future memory requests to that location are modified by the memory control unit 301 to correspond to the spare location indicated by the pointer 306. If future memory writes continue to address the failed memory location, eventually the unfailed memory from the spare pool may wear out. If this occurs, the remapping can be updated with a new location from the spare pool. In some cases, a new pointer is stored in the newly failed location, resulting in the control unit 301 traversing a linked list to determine the current unfailed location. In other cases, the pointer in the original failed memory location (from the first pool) is updated to point to the new location from the spare pool.

The memory system may further comprise a counter to maintain a count of remapping operations. In the illustrated example memory system 300, the counter 302 is a component of the memory control unit 301. In other systems, the counter may be located elsewhere. For example, the counter could be a component of the memory device 303, or could be a component connected to the memory control unit 301 via an out-of-band communication link.

In some implementations, the memory control unit 301 is to perform wear-leveling on the memory device 303 at a wear-leveling rate. The memory control unit may perform wear-leveling by remapping the addresses of memory writes at a wear-leveling rate. When performing a wear-leveling remap, the memory control unit 301 may remap a write request address from a first location within the normal pool of memory to a second location within the normal pool of memory. The wear-leveling rate may be determined based on various considerations, such as the type of wear-leveling to be performed, the desired memory lifetime, the type of workloads the system will encounter, and the type of NV memory used in the device 303. For example, using start-gap wear-leveling, a typical system might have a wear-leveling rate of 100, meaning that a write address is remapped every 100 writes.

The memory control unit 301 may use the counter to determine a remapping rate and modify the wear-leveling rate based on the remapping rate. For example, the memory control unit 301 may determine the remapping rate by polling the counter at a polling rate and dividing the change in the counter by the time between polls.

The memory control unit 301 may use the remapping rate to adjust the wear-leveling rate as described with respect to block 102 of FIG. 1 or blocks 202-206 of FIG. 2. For example, the memory control unit 301 may increase the wear-leveling rate if the remapping rate exceeds a threshold and decrease the wear-leveling rate if the remapping rate is lower than a second threshold.

In some implementations, the memory control unit 301 may send an alert if the remapping rate exceeds a threshold. For example, the memory control unit may send the alert as described with respect to block 209 of FIG. 2. In various examples, the alert may be sent in-band over the memory bus or out-of-band over a management bus. For example, the alert may be sent to the operating system or to a management system. In some implementations, the alert may include an indication that the remapping rate has exceeded a threshold amount. In further implementations, the alert may include a most recent memory location or list of recent memory locations being written that provoked memory rewrites.

In further implementations, the memory control unit 301 may reduce functionality of the memory device based on the remapping rate. For example, the memory control unit 301 may reduce the frequency of allowed access to the failed memory location, to the region undergoing wear-leveling, or to the entire memory device 303. As another example, the memory control unit 301 may reduce the bandwidth of the memory device 303. In one example, the memory control unit 301 may reduce the functionality if the remapping rate fails to return to a lower threshold amount within a set time. In another example, the memory control unit 301 may reduce the functionality if the remapping rate increases past another threshold. For example, the memory control unit 301 may perform block 208 of FIG. 2.

Figure 4:
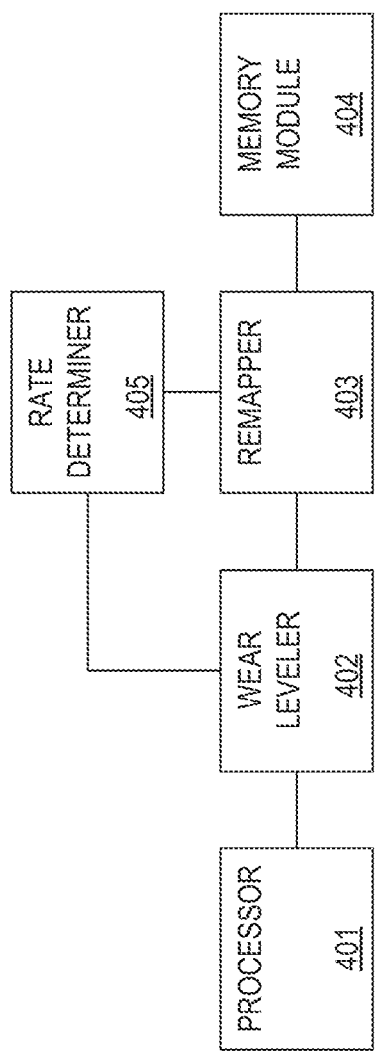
FIG. 4 illustrates an example system including a processor, a wear leveler, a remapper, a memory module, and a rate determiner.

FIG. 4 illustrates an example system including a processor 401, a wear leveler 402, a remapper 403, a memory module 404, and a rate determiner 405. For example, the illustrated system may include a memory sub-system as described with respect to FIG. 3, including a memory control unit to execute the wear leveler 402, remapper 403, and rate determiner 405. For example, the memory control unit may execute these components as software stored on a non-transitory computer readable medium, as hardware, or as a combination thereof.

The system may include a processor 401. For example, the processor 401 may be a main system processing unit, which may be coupled to or integrated with a memory controller. As another example, the processor 401 may be a management processor, such as a processor of a baseboard management controller.

The system may further include a memory module 404. In some cases, the memory module 404 may be a memory device, such as device 303 of FIG. 3. In further cases, the memory module 404 may include a control unit, such as the control unit 301 of FIG. 3.

The remapper 403 may remap a failed memory location of the memory module to an unfailed memory location of the memory module by storing a pointer to the unfailed memory location. In some implementations, the remapper 403 may be a component of a memory controller integrated with the processor 401. In other implementations, the remapper 403 may be a component of the memory module 404. In still further implementations, the remapper 403 may be an intermediary component between the processor 401 and the memory module 404.

When receiving a write request to a failed memory location from the wear leveler 402, the remapper 403 may create a pointer to an unfailed memory location and substitute the address of the unfailed memory location into the write request. Future reads and writes to the remapped location will have their addresses similarly replaced. For example, the remapper 403 may operate as described above with respect to the memory control unit 301.

The rate determiner 405 may monitor the operations of the remapper 403 to determine a remapping rate. For example, the rate determiner 405 may operate as described with respect to block 101 of FIG. 1 or block 201 of FIG. 2.

The system may further comprise a wear leveler 402. The wear leveler 402 may perform wear-leveling on memory requests sent by the processor 401 at a wear-leveling rate. For example, the wear leveler 402 may perform start-gap wear-leveling on memory requests from the processor.

In some implementations, the rate determiner 405 may feed the rate information to the wear leveler 402 to control the wear-leveling rate. For example, the rate determiner 405 may send the current remapping rate to the wear leveler 402. In this example, the wear leveler 402 may adjust its wear-leveling rate based on the current remapping rate.

In other implementations, the rate determiner 405 may send control information to the wear leveler based on the remapping rate. For example, the rate determiner 405 may determine a new wear-leveling rate based on the current remapping rate and may send the new rate to the wear leveler 402. As another example, the rate determiner 405 may send a control signal to the wear leveler to increase or decrease the wear-leveling rate by a predefined amount.

Figure 5:
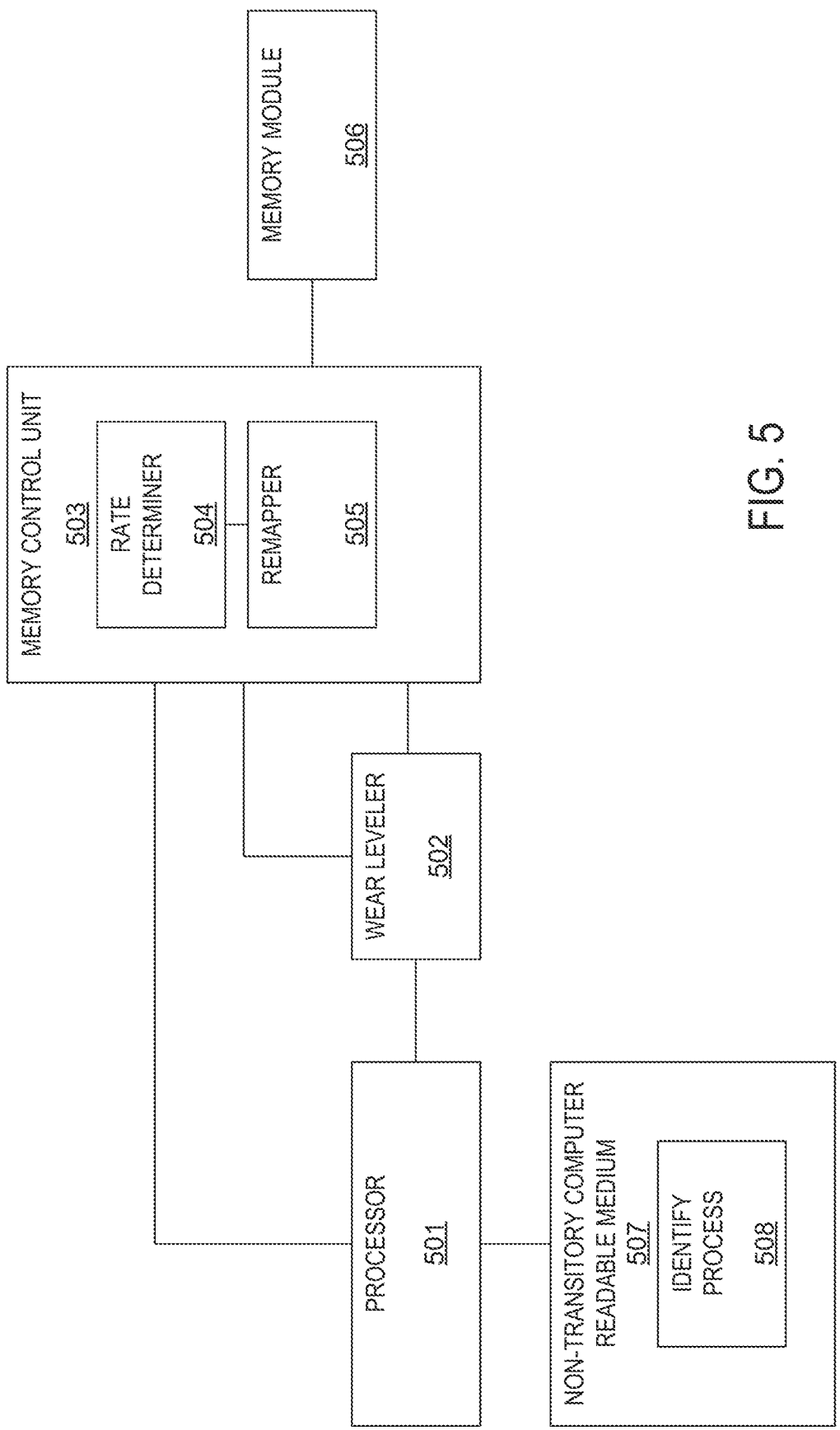
FIG. 5 illustrates an example system including a memory control unit comprising a remapper and rate determiner.

FIG. 5 illustrates an example system including a memory control unit 503 comprising a remapper 505 and rate determiner 504. For example, the illustrated system may be an implementation of the system of FIG. 4. Accordingly, the system may include a processor 501, a wear leveler 502, a remapper 505, a rate determiner 504, and a memory module 506 implemented as described with respect to the processor 401, the wear leveler 402, the remapper 403, the rate determiner 405, and the memory module 404 of FIG. 4, respectively.

The example system may include a memory control unit 503 comprising the rate determiner 504. For example, the memory control unit 503 may be as described with respect to the memory control unit 301 of FIG. 3. In some implementations, the memory control unit 503 may reduce a functionality of the memory module 506 if the remapping rate exceeds a threshold. For example, the memory control unit 503 may perform block 208 of FIG. 2.

In this example system, the rate determiner 504 may provide an alert and address of a failed memory location to the processor 501. For example, the rate determiner 504 may provide this information if the remapping rate exceeds an alert threshold.

The processor 501 may execute instructions 508 stored on a non-transitory computer readable medium 507. For example, the medium 507 may comprise random access memory (RAM), NV memory, flash memory, or storage. In some cases, the medium 507 may be the memory module 506. The instructions 508 may be executable to use the address to identify a process contributing to memory failure. For example, the instructions 508 may be executable by the processor 501 to review a history of memory writes to determine the process that requested a write to the failed memory location.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

The invention claimed is:

1. A method, comprising:
   determining a remapping rate of remapping operations on a memory module, each remapping operation comprising storing a pointer to an unfailed memory location within a failed memory location; and
   adjusting a wear-leveling rate on the memory module based on the remapping rate, including:
      increasing the wear-leveling rate if the remappinq rate exceeds a remapping rate threshold value; and
      decreasing the wear-leveling rate if the remappinq rate is below a second remappinq rate threshold value.

2. The method of claim 1, wherein determining the rate of remapping operations comprising:
   maintaining a counter of remapping operations; and
   reading the counter at a counter reading rate.

3. The method of claim 1, further comprising:
   reducing a functionality of the memory module if the remapping rate exceeds a second remapping rate threshold value.

4. The method of claim 3, wherein reducing the functionality of the memory module comprises reducing write access to the failed memory location or reducing a bandwidth of the memory module.

5. The method of claim 1, further comprising:
   sending an alert based on the remapping rate.

6. A memory system, comprising:
   a memory device comprising a plurality of memory locations;
   a memory control unit to remap a failed memory location to an unfailed memory location by storing a pointer to the unfailed memory location in the failed memory location; and
   a counter to maintain a count of remapping operations wherein the memory control unit is to:
   perform wear-leveling on the memory device at a wear-leveling rate;
   use the counter to determine a remapping rate, and modify the wear-leveling rate based on the remapping rate by increasing the wear-leveling rate if the remapping rate exceeds a first threshold and decreasing the wear-leveling rate if the remapping rate is lower than a second threshold.

7. The memory system of claim 6, wherein the memory control unit is to:
   use the counter to determine a remapping rate; and
   send an alert if the remapping rate exceeds a threshold.

8. A system, comprising:
   a processor;
   a memory module;
   a remapper to remap a failed memory location of the memory module to an unfailed memory location of the memory module by storing a pointer to the unfailed memory location;
   a rate determiner to determine a remapping rate; and
   a wear leveler to perform memory wear-leveling at a wear level rate set according to the remapping rate; and
   a memory control unit comprising the rate determiner, wherein the memory control unit is to reduce a functionality of the memory module if the remapping rate exceeds a threshold.

9. The system of claim 8, wherein:
   the rate determiner is to provide an alert and address of the failed memory location if the remapping rate exceeds a threshold; and
   the system further comprises a non-transitory computer readable medium storing instructions executable by the processor to:
   use the address of the faded memory location to identify a process contributing to memory failure.

* * * * *